US007982621B2

(12) United States Patent
Park et al.

(10) Patent No.: US 7,982,621 B2
(45) Date of Patent: Jul. 19, 2011

(54) POWER CONTROL APPARATUS

(75) Inventors: Dong-Ik Park, Seoul (KR); Soon-Youl Kwon, Suwon-si (KR)

(73) Assignee: Samsung Electronics Co., Ltd (KR)

(*) Notice: Subject to any disclaimer, the term of this patent is extended or adjusted under 35 U.S.C. 154(b) by 504 days.

(21) Appl. No.: 12/200,036

(22) Filed: Aug. 28, 2008

(65) Prior Publication Data
US 2009/0058664 A1 Mar. 5, 2009

(30) Foreign Application Priority Data

Aug. 28, 2007 (KR) .................. 10-2007-0086656

(51) Int. Cl.
*G08B 17/00* (2006.01)
(52) U.S. Cl. ......... 340/584; 340/589; 340/635; 340/3.1; 340/665
(58) Field of Classification Search .................. 340/589, 340/584, 635, 3.1, 665
See application file for complete search history.

(56) References Cited

U.S. PATENT DOCUMENTS

| 7,828,743 | B2 * | 11/2010 | Fraden | 600/549 |
| 2008/0108340 | A1 * | 5/2008 | Karstens | 455/418 |
| 2009/0195350 | A1 * | 8/2009 | Tsern et al. | 340/3.1 |
| 2010/0131749 | A1 * | 5/2010 | Kim et al. | 713/100 |
| 2010/0328074 | A1 * | 12/2010 | Johnson et al. | 340/573.1 |

* cited by examiner

*Primary Examiner* — Travis R Hunnings
(74) *Attorney, Agent, or Firm* — The Farrell Law Firm, P.C.

(57) ABSTRACT

Disclosed is an apparatus for controlling power of an electronic device, controlled by a touch input. To this end, a power control apparatus for an electronic device according to a preferred embodiment of the present invention is disclosed including a touch sensor for sensing a user's touch by a user's finger or the like, and a temperature sensor for sensing a body temperature detected through the touch. Through such a touch sensor and such a temperature sensor, the power control apparatus senses the touch and body temperature of a user, and controls the power of the electronic device. As a result, even without a separate power button installed on the outside of the electronic device, it becomes possible to control the power of the electronic device.

11 Claims, 3 Drawing Sheets

POWER CONTROL APPARATUS

PRIORITY

This application claims priority under 35 U.S.C. §119(a) to an application filed with the Korean Intellectual Property Office on Aug. 28, 2007 and assigned Serial No. 2007-86656, the contents of which are incorporated herein by reference.

BACKGROUND OF THE INVENTION

1. Field of the Invention

The present invention relates to a power control apparatus, and more particularly to an apparatus for controlling the power of an electronic device.

2. Description of the Related Art

In general, in order to operate an electronic device, such as a mobile communication terminal, it is necessary to use a physical switch installed on the outside of the electronic device. Such a physical switch may be a dome switch, a tact switch, etc. According to the conventional scheme, since power supplied through such a dome switch or tact switch, and an element such as a transistor is used to supply power to a power management Integrated Circuit (IC), at least one switch must exist on the outside of an electronic device in order to operate the electronic device.

Presently, when switching the power of an electronic device on or off, the user must press a power switch for a predetermined time period. A procedure of applying power in a general electronic device will now be described with reference to FIG. 1.

FIG. 1 is a circuit diagram illustrating the configuration of a power supply unit in a conventional electronic device. In order to supply power to an electronic device, a power button 100 included in the electronic device must be pressed. As the power button 100 is pressed, a switch 110 is switched on to supply battery power 120 to a transistor 130. When the battery power 120 is supplied to the transistor 130, the transistor outputs a high signal, and a controller (not shown) of the electronic device operates a power management integrated circuit (PMIC), thereby initializing the electronic device and performing a basic operation.

Since such a conventional electronic device requires transferring power to the PMIC in order for the electronic device to be powered on, pressing a key is required through a physical switch. Also, as the size of the electronic devices are reduced, the space for placing a keypad becomes smaller, so that the area for placing a power button to control power has also become an issue. In addition, frequently pressing a power button may cause an error in the operation of the power button. Meanwhile, in connection with a mobile communication terminal, the design of the mobile communication terminal has become a very important aspect, and such a tendency also requires a change in the design of a keypad, including a power button, etc.

SUMMARY OF THE INVENTION

Accordingly, the present invention provides a power control apparatus for overcoming a limitation in key placement in electronic devices.

In addition, the present invention provides a power control apparatus capable of satisfying various demands of users in the design of electronic devices.

In accordance with an aspect of the present invention, there is provided an apparatus for controlling power in an electronic device, the apparatus including a temperature sensor having a first input node and a second input node, and outputting voltages according to signals input through the first and the second input nodes, the first input node sensing a body temperature detected through a touch of a user, and the second input node being spaced by a predetermined interval from the first input node; two comparators for receiving each of the voltages output from the temperature sensor, each comparator outputting one of high and low signals according to the received voltages; a power determination unit for outputting an XOR operation result signal when a high signal is output from one of the comparators; a power switching unit for performing a switching operation according to the signal output from the power determination unit; and a touch sensor for sensing a touch input by the user when a voltage is applied according to the switching operation of the power switching unit, and outputting a power control signal when there is a current change according to the sensed touch input.

In accordance with another aspect of the present invention, there is provided an apparatus for controlling power in an electronic device, the apparatus including a temperature sensing unit for sensing a body temperature detected through a touch of a user, and outputting a signal according to a detected temperature difference; a power switching unit for performing a switching operation according to the signal output from the temperature sensing unit; and a touch sensor for sensing a touch input by the user when a voltage is applied according to the switching operation of the power switching unit, and outputting a power control signal when there is a current change according to the sensed touch input.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE PREFERRED EMBODIMENT

Hereinafter, a preferred embodiment of the present invention will be described with reference to the accompanying drawings. In the following description, a detailed description of known functions and configurations incorporated herein will be omitted when it may make the subject matter of the present invention rather unclear.

The present invention implements a function of controlling power of an electronic device by a touch input only. To this end, a power control apparatus for an electronic device according to a preferred embodiment of the present invention includes a touch sensor for sensing a user's touch by a user's finger or the like, and a temperature sensor for sensing a body temperature detected by the touch. Through such a touch sensor and such a temperature sensor, the power control apparatus senses the touch and body temperature of a user, and controls the power of the electronic device. As a result, even without a separate power button installed on the outside of the electronic device, it is possible to control the power of the electronic device.

Figure 1:
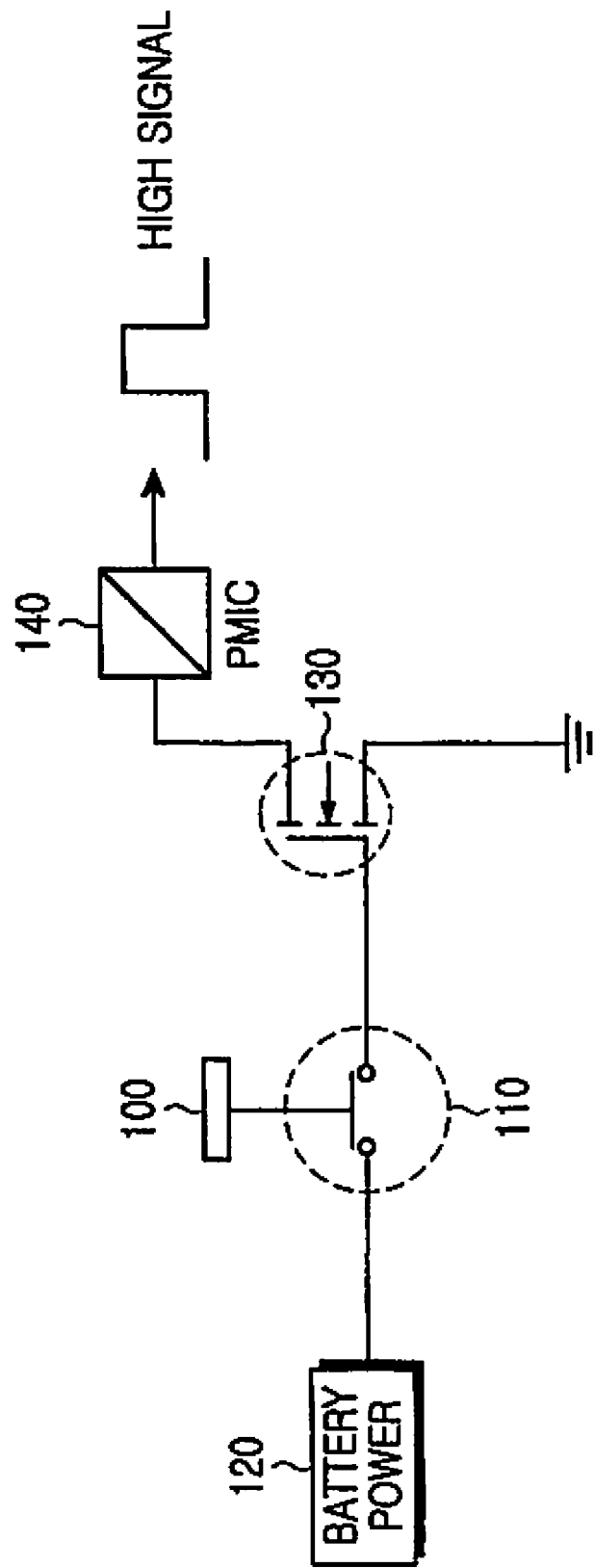
FIG. 1 is a circuit diagram illustrating the configuration of a power supply unit in a conventional electronic device.
Figure 2:
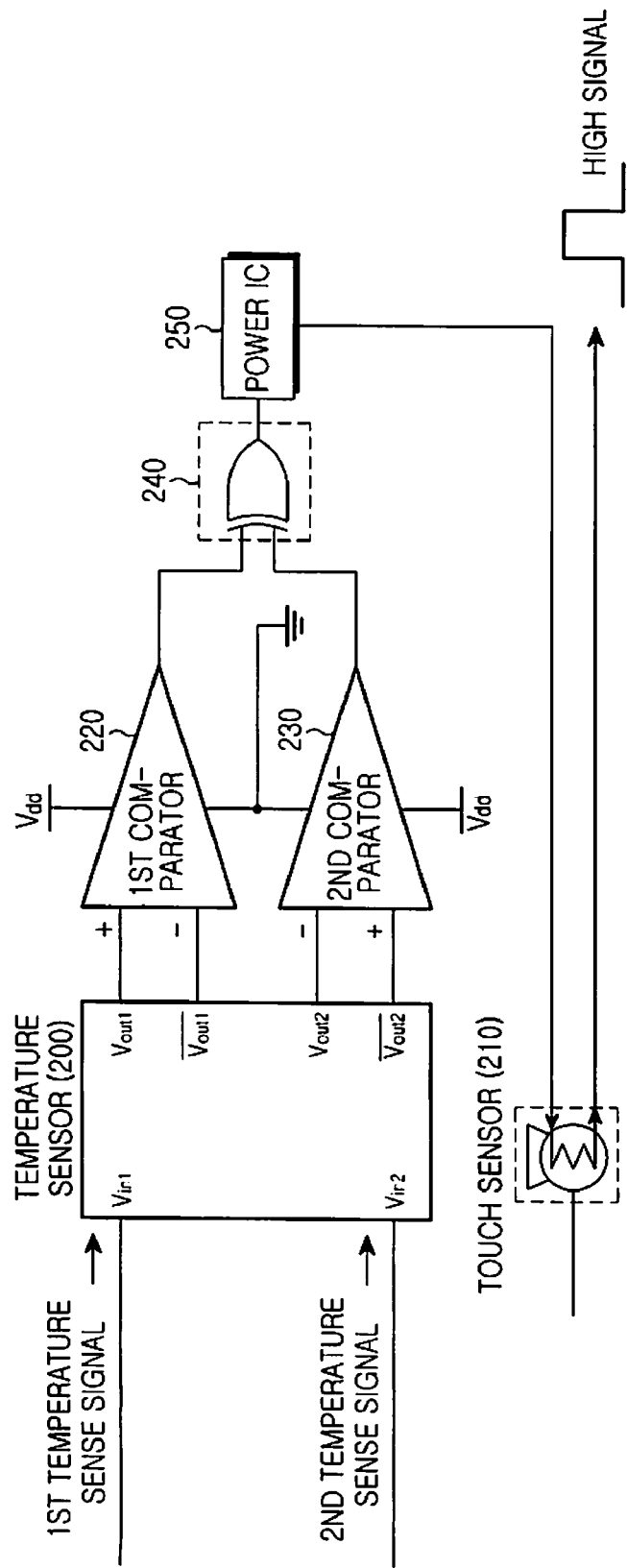
FIG. 2 is a circuit diagram illustrating the configuration of a power control apparatus for an electronic device according to an exemplary embodiment of the present invention.

FIG. 2 is a circuit diagram illustrating the configuration of a power control apparatus for an electronic device according to the preferred embodiment of the present invention. The power control apparatus includes a temperature sensor 200, a touch sensor 210, two comparators 220 and 230, a power determination unit 240, and a power management IC 250.

The temperature sensor 200 has two input nodes, which can sense temperatures. According to the preferred embodiment of the present invention, a first input node of the two input nodes functions to sense a body temperature detected through a touch of a user, such as a user's finger, and a second input node is used to identify a temperature difference between the two input nodes. The first input node is disposed at an area which can be pressed by a user's finger, and the second input node is disposed at an area which is spaced by a predetermined distance from the first input node so that a temperature difference between the two nodes can be identified. For example, it is preferred that the first input node is disposed at a position where a virtual power button having a fingertip touch is indicated, and the second input node is disposed at a position where no part of the user can touch when the user grasps the electronic device from the outside. When the first and the second input nodes are installed at different positions as described above, it is possible to identify a body temperature detected through a touch of a user in a regular environment.

Also, the temperature sensor 200 has four output nodes, that is, two positive output nodes (+) and two negative output nodes (−), forming two pairs of positive and negative output nodes, with one pair connected to a first comparator 220 and the other pair connected to a second comparator 230. The temperature sensor 200 operates without separate power. That is, the temperature sensor 200 is only activated upon receiving the first and the second temperature sense signals from the first and the second input nodes, respectively.

Meanwhile, when a temperature difference between the first and the second input nodes is detected by sensor 200, the input node having a relatively higher temperature inputs a high signal to the temperature sensor 200, while the other input node having a relatively lower temperature inputs a low signal to the temperature sensor 200. For example, when a body temperature detected through a touch of the user is sensed only at the position where the first input node has been installed, a high signal is input as the first temperature sense signal to the temperature sensor 200 through the first input node, and a low signal is input as the second temperature sense signal to the temperature sensor 200 through the second input node. The temperature sensors employed herein bring about the advantage over a sole touch sensor design in that accidental touches on a touch sensor, such as touches occur in a user's pocket, can be screened because temperatures on the sensors do not change.

When a temperature difference occurs as described above, voltages are generated according to the first and the second temperature sense signals in the temperature sensor 200, and then outputs from the temperature sensor 200 are applied to the comparators 220 and 230. In this case, since a temperature input through the first input node of the temperature sensor 200 may be higher or lower than the input through the second input node thereof, the power control apparatus includes two comparators in order to consider both cases.

Meanwhile, the first comparator 220 and second comparator 230 operate by battery power $V_{dd}$ supplied by the electronic device. When certain voltages are applied to the first comparator 220 and second comparator 230, each comparator 220 and 230 outputs a high signal or a low signal according to the applied voltages. Especially, according to the preferred embodiment of the present invention, when a temperature difference occurs, one of the comparators always outputs a high signal, while the other comparator outputs a low signal. When such two comparators 220 and 230 are used, a user's touch can be sensed when the temperature of the touching finger is lower than that of the electronic device itself, as well as when the temperature of the touching finger of the user is higher than that of the electronic device itself. Accordingly, regardless of whether the temperature of a user's finger is higher or lower than that of the electronic device, when a temperature difference occurs, one of the two comparators 220 and 230 outputs a high signal at all times.

The power determination unit 240 may include an XOR gate, and performs a logic XOR operation on output signals of the comparators 220 and 230. A result of the logic XOR operation of the power determination unit 240 varies depending on the output signals of the first and the second comparators 220 and 230. That is, when any one of the first and the second comparators 220 and 230 outputs a high signal, the power determination unit 240 outputs a high signal as a result of the logic XOR operation. The output signal of the power determination unit 240 is then transferred to the power management IC 250, thereby turning on the power management IC 250. The power management IC 250 is switched on or off according to an output signal of the power determination unit 240, wherein, when receiving a high signal from the power determination unit 240, the power management IC 250 is switched to supply power to the touch sensor 210. In this case, the battery power $V_{dd}$ supplied to the first and the second comparators 220 and 230 may be supplied, even to the power management IC 250 via the power determination unit 240. Meanwhile, such a temperature difference may occur due to ambient influences without an actual user touch. For example, when a virtual power button portion where the first input node is positioned is exposed to the sun, a temperature difference may occur. In order to prevent the power control apparatus from malfunctioning due to such a reason, the present invention further provides a method of sensing an actual touch by means of a touch sensor, in addition to sensing a temperature by means of the temperature sensor. By such a construction, when a temperature difference occurs, it is possible to determine if the temperature difference occurs by an actual user touch. To this end, the present invention implements a circuit of a power control apparatus such that the touch sensor 210 can sense a touch input only when the power management IC 250 is turned on due to temperature differences.

The touch sensor 210 functions to sense a touch input, and preferably, may be a capacitive touch sensor so as to sense a touch input by a user body. The capacitive touch sensor 210 operates according to a current change which is caused by a touch of a user's finger. Since the touch sensor 210 must be located at a position where a user's fingertip touches, it is preferred that the touch sensor 210 is installed at the same position as the first input node of the temperature sensor 200. The operation of such a touch sensor 210 will now be described.

A result of the logic XOR operation by the power determination unit 240 determines if the power management IC 250 operates. That is, a high signal is output as a result of the logic XOR operation, and thus the power management IC 250 is turned on, thereby applying a voltage to the touch sensor 210. Thereafter, when a current change occurs due to a user's touch, the touch sensor 210 outputs a high signal. The high signal output from the touch sensor 210 is transferred to a Power Management Integrated Circuit (PMIC), so that the electronic device is powered on and initialized while performing a basic operation. Although the embodiment of the present invention describes a case of using a capacitive touch sensor, the present invention can also be implemented by using a resistive touch sensor.

Meanwhile, Tables 1 to 4 below are logic tables according to operation scenarios of the power control apparatus having the aforementioned construction.

TABLE 1

|  | Output Signal | Final Output Signal |
|---|---|---|
| 1$^{st}$ Temperature Sense Signal | High signal | High signal |
| 2$^{nd}$ Temperature Sense Signal | Low signal |  |
| 1$^{st}$ Comparator | High signal |  |
| 2$^{nd}$ Comparator | Low signal |  |
| Touch Sensor | High signal |  |

TABLE 2

|  | Output Signal | Final Output Signal |
|---|---|---|
| 1$^{st}$ Temperature Sense Signal | High signal | Low signal |
| 2$^{nd}$ Temperature Sense Signal | Low signal |  |
| 1$^{st}$ Comparator | High signal |  |
| 2$^{nd}$ Comparator | Low signal |  |
| Touch Sensor | Low signal |  |

TABLE 3

|  | Output Signal | Final Output Signal |
|---|---|---|
| 1$^{st}$ Temperature Sense Signal | Low signal | High signal |
| 2$^{nd}$ Temperature Sense Signal | High signal |  |
| 1$^{st}$ Comparator | Low signal |  |
| 2$^{nd}$ Comparator | High signal |  |
| Touch Sensor | High signal |  |

TABLE 4

|  | Output Signal | Final Output Signal |
|---|---|---|
| 1$^{st}$ Temperature Sense Signal | Low signal | Low signal |
| 2$^{nd}$ Temperature Sense Signal | High signal |  |
| 1$^{st}$ Comparator | Low signal |  |
| 2$^{nd}$ Comparator | High signal |  |
| Touch Sensor | Low signal |  |

As shown in Tables 1 to 4, a final output signal is determined depending on an output signal of the touch sensor, and the electronic device is powered on when the final output signal is a high signal. As described above, when the first and the second temperature sense signals are different, the output signals of the first and the second comparators become different, too. The touch sensor begins to operate when one of the first and the second comparators outputs a high signal, and the touch sensor must output a high signal due to a touch of a body before the electronic device is powered on. Although the embodiment of the present invention has been described regarding a case of powering on an electronic device, the present invention can be applied to a case of powering off an electronic device. As described above, it is necessary to sense a temperature difference by the temperature sensor 200 and to sense an actual touch through the touch sensor 210 before the control operation of the power control apparatus is performed.

Figure 3:
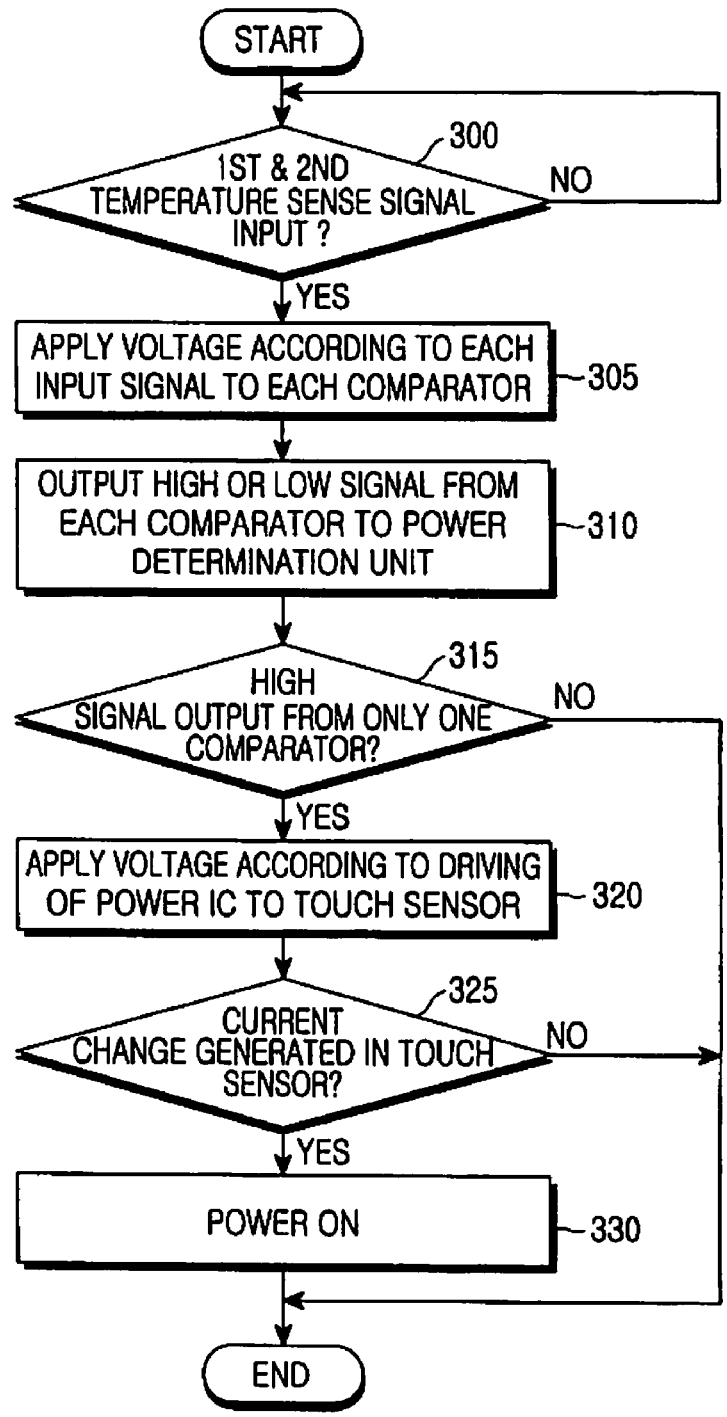
FIG. 3 is a flowchart illustrating the operation of the power control apparatus according to an exemplary embodiment of the present invention.

Hereinafter, the operation of the power control apparatus according to the preferred embodiment of the present invention will be described with reference to FIG. 3. FIG. 3 is a flowchart illustrating the operation of the power control apparatus according to the preferred embodiment of the present invention.

When the user presses a virtual power button, a first temperature sense signal and a second temperature sense signal are input to the temperature sensor 200 through the first and the second input nodes. In step 300, it is determined if a first and a second temperature sense signals are input to the temperature sensor 200 according to such a press of the virtual power button by the user. When there are a first and a second temperature sense signals input to the temperature sensor 200, the temperature sensor 200 applies voltages according to the input signals to the two comparators 220 and 230 in step 305. Then, each of the comparators 220 and 230 outputs a high signal or low signal according to the applied voltages to the power determination unit 240 in step 310. In other words, when a temperature difference occurs, either a high signal and a low signal, or a low signal and a high signal, are input from the first and the second comparators 220 and 230, respectively, to the input nodes of an XOR gate, which comprises the power determination unit 240.

Meanwhile, when a temperature difference occurs based on the first and the second temperature sense signals, only one of the two comparators 220 and 230 outputs a high signal. A high signal is output from a different comparator depending on whether the temperature of the first input node is higher or lower than the temperature of the second input node, and the fact that only one of the comparators outputs a high signal when a temperature difference occurs is the same at all times.

In order to determine such a temperature difference, it is necessary to determine if a high signal is output only from one comparator in step 315. When the condition of step 315 is satisfied, the power determination unit 240 outputs a high signal to the power management IC 250 as a result of a logic XOR operation, thereby driving the power management IC 250. Next, a voltage according to the driving signal of the power management IC 250 is applied to the touch sensor 210 in step 320. Then, in order to determine if the sensed temperature difference is caused by a touch of a user's finger, the touch sensor 210 determines if there is a current change in step 325. Such a current change is generated when a finger of the user touches a capacitive touch sensor 210. It is preferred that the touch sensor 210 is installed at the same position as that the first input node of the temperature sensor 200 so that the body temperature and the touch of a user can be sensed at the same time. When there is a current change due to a touch of a user's finger through the virtual power button, the touch sensor 210 outputs a high signal, thereby powering on the electronic device in step 330. Such a power-on operation is implemented by driving a PMIC, which supplies power to the components of the electronic device and initializes the electronic device, when a high signal is output from the touch sensor 210.

As described above, when two conditions, i.e. sensing the body temperature of a user and sensing a touch thereof, are satisfied at the same time, the power control operation is performed. Accordingly, since a control button can be implemented without installing a physical button on the outside of an electronic device, it is possible to overcome the limitation in the conventional key placement technology and to design and implement an electronic device with a smooth and seamless shape.

While the present invention has been shown and described with reference to a preferred embodiment thereof, it will be understood by those skilled in the art that various changes in form and details may be made therein without departing from the spirit and scope of the invention as defined by the appended claims set forth hereinafter.

What is claimed is:

1. An apparatus for controlling power in an electronic device comprising:
   a temperature sensor having a first input node and a second input node, and outputting voltages according to signals input through the first and the second input nodes, the first input node sensing a body temperature detected through a touch of a user, and the second input node being spaced by a predetermined interval from the first input node;
   two comparators for receiving each of the voltages output from the temperature sensor, each comparator outputting one of high and low signals according to the received voltages;
   a power determination unit for outputting an XOR operation result signal when a high signal is output from one of the comparators;
   a power switching unit for performing a switching operation according to the signal output from the power determination unit; and
   a touch sensor for sensing a touch input by the user when a voltage is applied according to the switching operation of the power switching unit, and outputting a power control signal when there is a current change according to the sensed touch input.

2. The apparatus as claimed in claim 1, wherein the touch sensor is a capacitive touch sensor.

3. The apparatus as claimed in claim 1, wherein the touch sensor is a resistive touch sensor.

4. The apparatus as claimed in claim 1, wherein the power determination unit comprises an XOR gate.

5. The apparatus as claimed in claim 1, wherein the first input node is disposed at a position where a virtual power button is indicated, and the virtual power button has a size corresponding to a fingertip of the user.

6. The apparatus as claimed in claim 4, wherein the touch sensor is installed at a position identical to that of the first input node.

7. The apparatus as claimed in claim 1, wherein the two comparators operate by battery power of the electronic device.

8. The apparatus as claimed in claim 1, wherein when a temperature difference is detected, one of the comparators outputs a high signal while a remaining comparator outputs a low signal at all times.

9. The apparatus as claimed in claim 1, further comprising a Power Management Integrated Circuit (PMIC) for powering on the electronic device by supplying power to components of the electronic device when the power control signal is output from the touch sensor.

10. An apparatus for controlling power in an electronic device, the apparatus comprising:
    a temperature sensing unit for sensing a body temperature detected through a touch of a user, and outputting a signal according to a detected temperature difference;
    a power switching unit for performing a switching operation according to the signal output from the temperature sensing unit; and
    a touch sensor for sensing a touch input by the user when a voltage is applied according to the switching operation of the power switching unit, and outputting a power control signal when there is a current change according to the sensed touch input.

11. The apparatus as claimed in claim 10, wherein the temperature sensing unit comprises:
    a temperature sensor having a first input node and a second input node, and outputting voltages according to signals input through the first and the second input nodes, the first input node sensing a body temperature detected through a touch of a user, the second input node being spaced by a predetermined interval from the first input node;
    two comparators for receiving each of the voltages output from the temperature sensor, and outputting signals according to the received voltages; and
    a power determination unit for outputting an XOR operation result signal when a signal according to a temperature difference is output through the comparators.

* * * * *